(12) United States Patent
Shikano

(10) Patent No.: US 9,171,772 B2
(45) Date of Patent: Oct. 27, 2015

(54) SEMICONDUCTOR DEVICE

(71) Applicant: Taketoshi Shikano, Tokyo (JP)

(72) Inventor: Taketoshi Shikano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/827,669

(22) Filed: Mar. 14, 2013

(65) Prior Publication Data

US 2014/0054751 A1    Feb. 27, 2014

(30) Foreign Application Priority Data

Aug. 24, 2012   (JP) ................................. 2012-185354

(51) Int. Cl.
     *H01L 23/367*      (2006.01)
     *H01L 25/07*      (2006.01)
     *H01L 23/31*      (2006.01)

(52) U.S. Cl.
     CPC .......... *H01L 23/367* (2013.01); *H01L 23/3677* (2013.01); *H01L 25/071* (2013.01); *H01L 25/072* (2013.01); *H01L 25/074* (2013.01); *H01L 23/3121* (2013.01); *H01L 2224/48091* (2013.01); *H01L 2224/48227* (2013.01);
     (Continued)

(58) Field of Classification Search
     CPC ................. H01L 2224/32145; H01L 25/0657; H01L 21/563; H01L 23/3135; H01L 2224/48091; H01L 2224/48227; H01L 23/3121
     USPC .................. 257/687, 686, 724, 733, 784, 787
     See application file for complete search history.

(56) References Cited

U.S. PATENT DOCUMENTS

| 5,757,080 | A | * | 5/1998 | Sota ............................... 257/777 |
| 6,448,506 | B1 | * | 9/2002 | Glenn et al. .................. 174/260 |
| 6,476,476 | B1 | | 11/2002 | Glenn |
| 6,577,013 | B1 | * | 6/2003 | Glenn et al. .................. 257/777 |
| 7,045,887 | B2 | * | 5/2006 | Karnezos ....................... 257/686 |

(Continued)

FOREIGN PATENT DOCUMENTS

| CN | 102820267 A | 12/2012 |
| JP | 04-280667 A | 10/1992 |

(Continued)

OTHER PUBLICATIONS

An Office Action issued by the German Patent Office on Jul. 29, 2014, which corresponds to German Patent Application No. 10 2013 210 972.5 and is related to U.S. Appl. No. 13/827,669; with English language translation.

(Continued)

*Primary Examiner* — Marcos D. Pizarro
*Assistant Examiner* — Sue Tang
(74) *Attorney, Agent, or Firm* — Studebaker & Brackett PC

(57) ABSTRACT

A semiconductor device comprises: a semiconductor package having a top surface, a bottom surface, and a through hole provided from the top surface to the bottom surface; and an electrode inserted into the through hole of the semiconductor package. The semiconductor package includes: an insulating substrate; a semiconductor chip on the insulating substrate; an electrode pattern on the insulating substrate and connected to the semiconductor chip; a resin sealing the insulating substrate, the semiconductor chip, and the electrode pattern; and an electrode section on an inner wall of the through hole and connected to the electrode pattern. The through hole penetrates the insulating substrate and the resin. The electrode inserted into the through hole is connected to the electrode section inside the semiconductor package.

7 Claims, 8 Drawing Sheets

(52) U.S. Cl.
CPC .................. *H01L2924/1305* (2013.01); *H01L 2924/13055* (2013.01)

(56) References Cited

U.S. PATENT DOCUMENTS

| | | | |
|---|---|---|---|
| 2004/0007771 A1* | 1/2004 | Shin et al. | 257/686 |
| 2005/0001331 A1 | 1/2005 | Kojima et al. | |
| 2007/0096289 A1* | 5/2007 | Enomoto et al. | 257/687 |
| 2007/0138624 A1 | 6/2007 | Sudo et al. | |
| 2007/0145563 A1 | 6/2007 | Punzalan et al. | |
| 2008/0185708 A1 | 8/2008 | Chen et al. | |
| 2009/0065923 A1* | 3/2009 | Chung | 257/687 |
| 2009/0250800 A1 | 10/2009 | Harayama et al. | |
| 2010/0013085 A1 | 1/2010 | Oi et al. | |
| 2011/0031599 A1* | 2/2011 | Jo | 257/686 |

FOREIGN PATENT DOCUMENTS

| | | |
|---|---|---|
| JP | 2005-039227 A | 2/2005 |
| JP | 2005-303018 A | 10/2005 |
| JP | 2007-173272 A | 7/2007 |
| JP | 2009-088150 A | 4/2009 |
| JP | 2010-027814 A | 2/2010 |
| JP | 2010-129801 A | 6/2010 |

OTHER PUBLICATIONS

An Office Action; "Notice of Reasons for Rejection," issued by the Japanese Patent Office on Jun. 23, 2015, which corresponds to Japanese Patent Application No. 2012-185354 and is related to U.S. Appl. No. 13/827,669; with English language partial translation.

* cited by examiner

SEMICONDUCTOR DEVICE

BACKGROUND OF THE INVENTION

1. Field of the Invention

The present invention relates to a semiconductor device wherein a plurality of semiconductor packages are connected each other.

2. Background Art

Connecting a plurality of semiconductor packages of the same structure in parallel allows an electric capacity to be changed depending on each product. In conventional semiconductor devices, a plurality of semiconductor packages are arranged two-dimensionally.

SUMMARY OF THE INVENTION

When a plurality of semiconductor packages are arranged two-dimensionally, a radiator fin that also serves to fix the semiconductor packages increases in size. Moreover, since leads are arranged on the sides of the semiconductor packages, a layout needs to be designed with lead positions taken into consideration. Furthermore, a base to fix terminals of the semiconductor packages and a space to fix the base are required, which leads to upsizing of the device.

A device is proposed in which a plurality of semiconductor packages are superimposed one on another and lead wires are inserted into through holes provided therein (e.g., see Japanese Patent Laid-Open No. 4-280667). However, since the through holes are provided in an insulating substrate not sealed with resin, there is a problem that creepage distances from other electrodes are short, which results in low withstand voltage.

In view of the above-described problems, an object of the present invention is to provide a semiconductor device which can increase the degree of freedom of the layout and the withstand voltage and be down-sized According to the present invention, a semiconductor device comprises: a semiconductor package having a top surface, a bottom surface, and a through hole provided from the top surface to the bottom surface; and an electrode inserted into the through hole of the semiconductor package. The semiconductor package includes: an insulating substrate; a semiconductor chip on the insulating substrate; an electrode pattern on the insulating substrate and connected to the semiconductor chip; a resin sealing the insulating substrate, the semiconductor chip, and the electrode pattern; and an electrode section on an inner wall of the through hole and connected to the electrode pattern. The through hole penetrates the insulating substrate and the resin. The electrode inserted into the through hole is connected to the electrode section inside the semiconductor package.

The present invention makes it possible to increase the degree of freedom of the layout and the withstand voltage and be down-sized.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
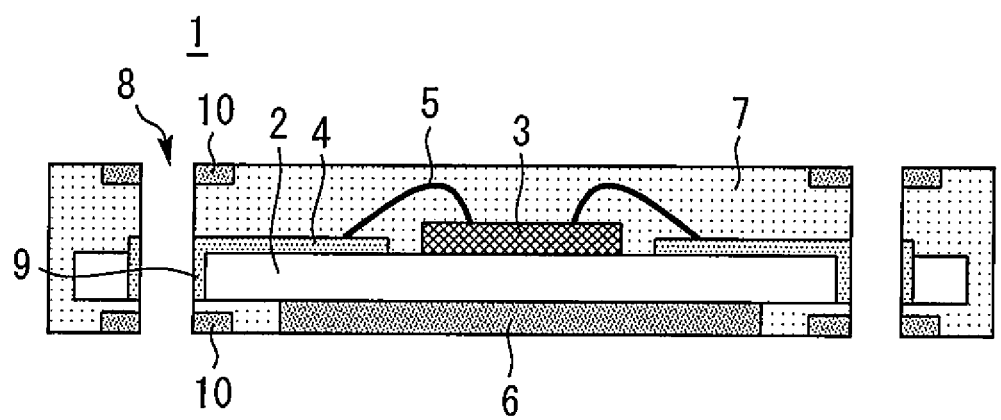
FIG. 1 is a cross-sectional view illustrating a semiconductor package according to a first embodiment of the present invention.

FIG. 1 is a cross-sectional view illustrating a semiconductor package according to a first embodiment of the present invention. A semiconductor chip 3 such as an IGBT (Insulated Gate Bipolar Transistor) or diode is disposed on an insulating substrate 2 in a semiconductor package 1. An electrode pattern 4 is disposed on the insulating substrate 2 and is connected to the semiconductor chip 3 via a wire 5. A tabular electrode may also be used instead of the wire 5. A heat-dissipating insulating plate 6 is disposed on the back of the insulating substrate 2. The insulating substrate 2, semiconductor chip 3, electrode pattern 4 and wire 5 are sealed with resin 7.

A through hole 8 is provided from a top surface to a bottom surface of the semiconductor package 1. This through hole 8 penetrates the insulating substrate 2 and the resin 7. An electrode section 9 is disposed on an inner wall of the through hole 8 and connected to the electrode pattern 4. An insulating material 10 is provided around the circumference of the through hole 8 at a top end and a bottom end of the through hole 8.

Figure 2:
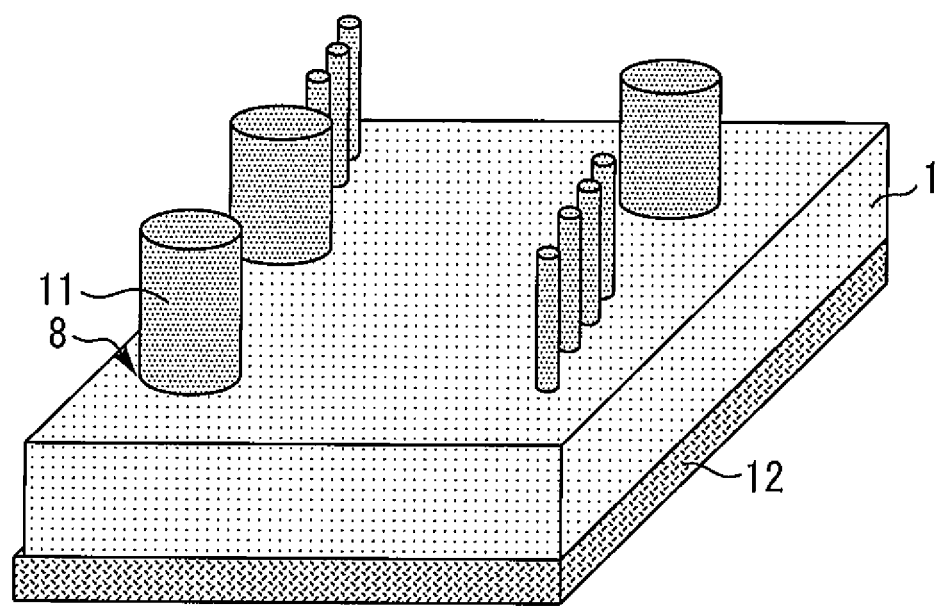
FIG. 2 and FIG. 3 are a perspective view and a cross-sectional view respectively illustrating the semiconductor device according to the first embodiment of the present invention.
Figure 3:
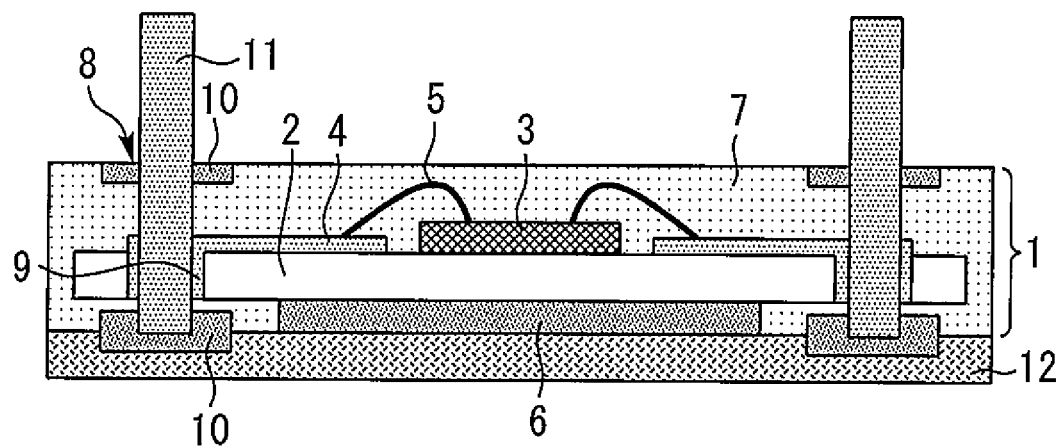

FIG. 2 and FIG. 3 are a perspective view and a cross-sectional view respectively illustrating the semiconductor device according to the first embodiment of the present invention. An electrode 11 is inserted into the through hole 8 of the semiconductor package 1 and connected to the electrode section 9 inside the semiconductor package 1. A heat spreader 12 is disposed on the bottom surface of the semiconductor package 1. The insulating material 10 is disposed under the through hole 8 to insulate the electrode 11 from the heat spreader 12.

The electrode 11 is connected to the semiconductor chip 3 via the electrode section 9 and the electrode pattern 4 to constitute a circuit. Power can be supplied to the semiconductor chip 3 via this electrode 11. The electric capacity can be changed according to the product by electrically and mechanically connecting a plurality of semiconductor packages 1 through the electrode 11.

Figure 4:
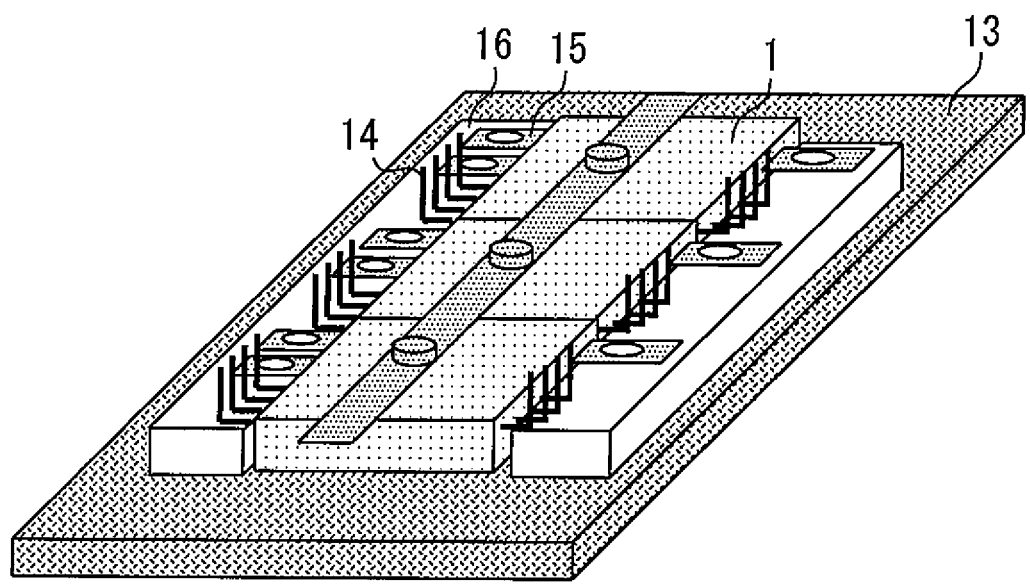
FIG. 4 and FIG. 5 are a perspective view and a cross-sectional view respectively illustrating a semiconductor device according to a comparative example.
Figure 5:
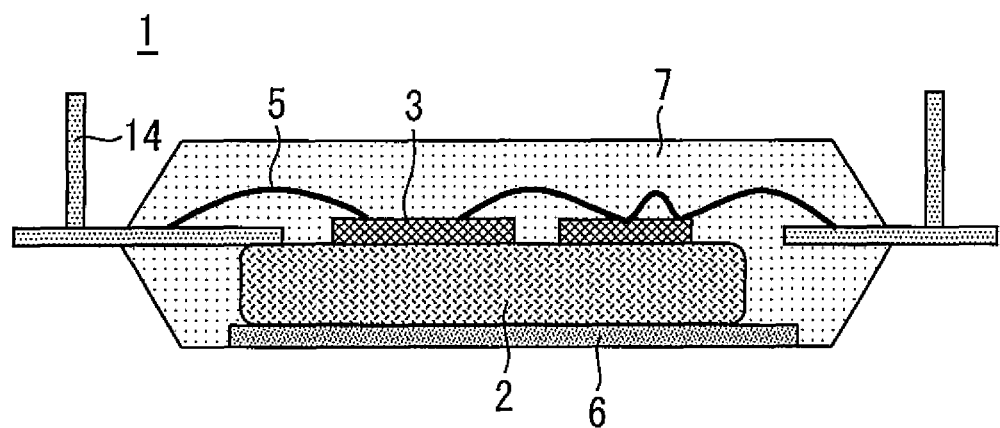

Next, effects of the present embodiment will be described in comparison with a comparative example. FIG. 4 and FIG. 5 are a perspective view and a cross-sectional view respectively illustrating a semiconductor device according to a comparative example. In the comparative example, a plurality of semiconductor packages 1 are arranged two-dimensionally, and therefore a radiator fin 13 that also serves to fix the semiconductor packages 1 increases in size. Furthermore, since leads 14 are arranged on sides of the semiconductor packages 1, a layout needs to be designed with lead positions taken into consideration. Furthermore, a base 16 to fix terminals 15 of the semiconductor packages 1 and a space to fix the base 16 are necessary, which leads to upsizing of the device.

In contrast, the present embodiment assembles a plurality of semiconductor packages 1 three-dimensionally, inserts the electrode 11 into the through holes 8 of the semiconductor packages 1 and electrically and mechanically connects the semiconductor packages 1 together. This allows the size of the device to be reduced and also increases the degree of freedom of the layout.

Furthermore, according to the present embodiment, the electrode section 9 is disposed on the inner wall of the through hole 8 that penetrates the insulating substrate 2 and the resin 7. Therefore, since the electrode section 9 connected to the electrode 11 is disposed inside the resin 7 of the semiconductor package 1, the creepage distances from other electrodes are long and the withstand voltage is high.

Second Embodiment

Figure 6:
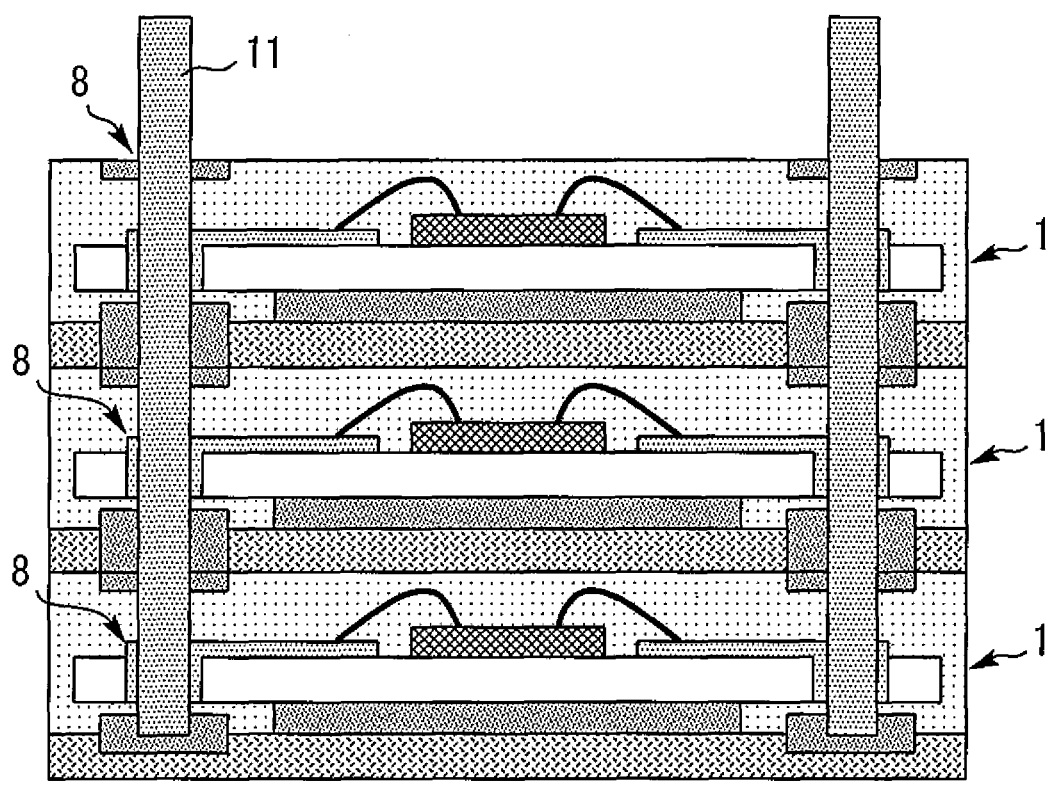
FIG. 6 is a cross-sectional view illustrating a semiconductor device according to a second embodiment of the present invention.

FIG. 6 is a cross-sectional view illustrating a semiconductor device according to a second embodiment of the present invention. Three semiconductor packages 1 are superimposed one on another in the same direction and an electrode 11 is inserted into their respective through holes 8. A power device is thereby configured in which the three semiconductor packages 1 are electrically and mechanically connected together to increase the capacity.

Third Embodiment

Figure 7:
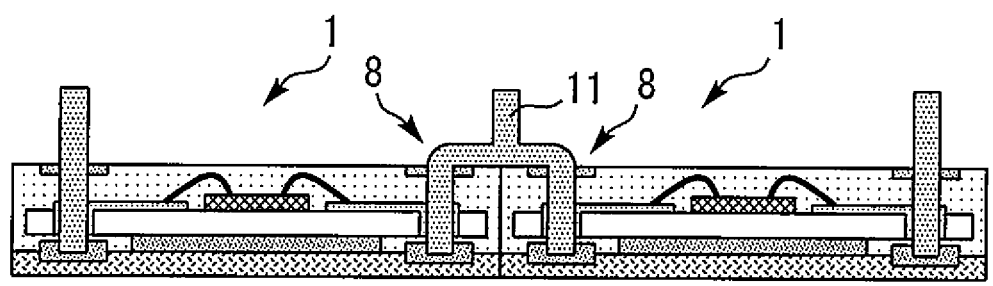
FIG. 7 is a cross-sectional view illustrating a semiconductor device according to a third embodiment of the present invention.

FIG. 7 is a cross-sectional view illustrating a semiconductor device according to a third embodiment of the present invention. Two semiconductor packages 1 are arranged on the same plane and a U-shaped electrode 11 is inserted into through holes 8 of both semiconductor packages 1. A power device is thereby configured in which the two semiconductor packages 1 are electrically and mechanically connected together to increase the capacity.

Fourth Embodiment

Figure 8:
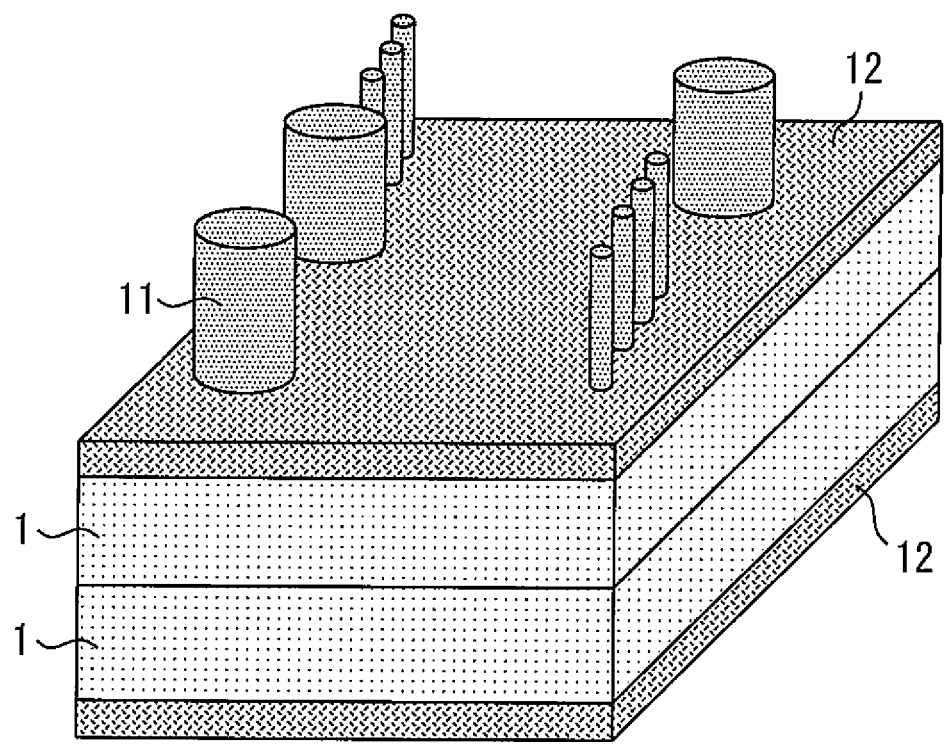
FIG. 8 and FIG. 9 are a perspective view and a cross-sectional view respectively illustrating a semiconductor device according to a fourth embodiment of the present invention.
Figure 9:
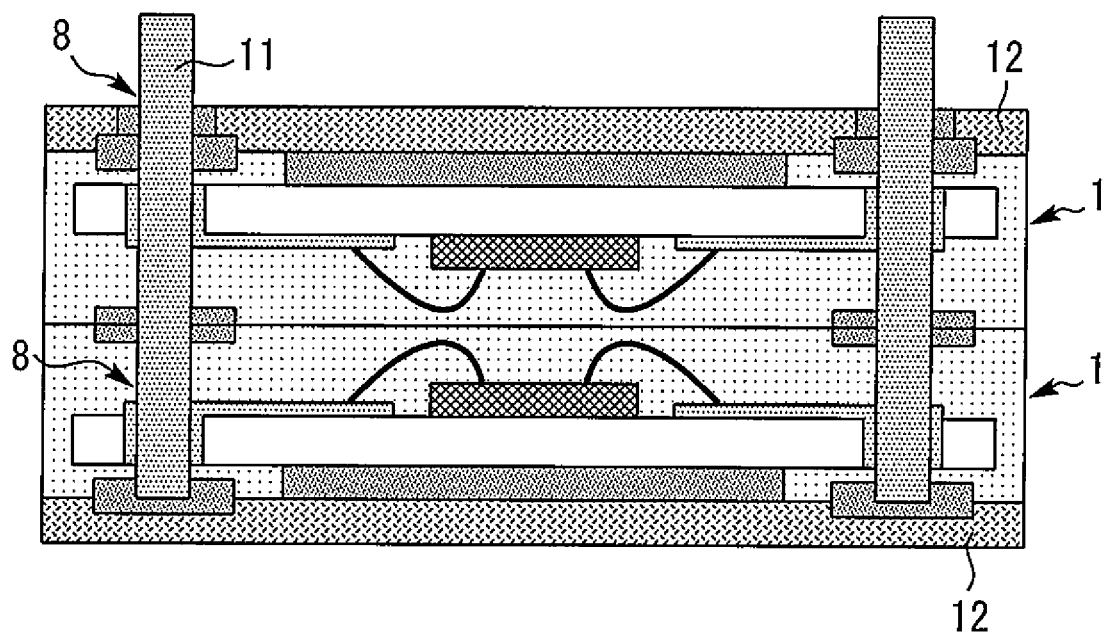

FIG. 8 and FIG. 9 are a perspective view and a cross-sectional view respectively illustrating a semiconductor device according to a fourth embodiment of the present invention. Top surfaces of two semiconductor packages 1 are placed face to face. Heat spreaders 12 are disposed on bottom surfaces of the two semiconductor packages 1 respectively. An electrode 11 is inserted into through holes 8 of the two semiconductor packages 1. A power device is thereby configured in which the two semiconductor packages 1 are electrically and mechanically connected together to increase the capacity.

Fifth Embodiment

Figure 10:
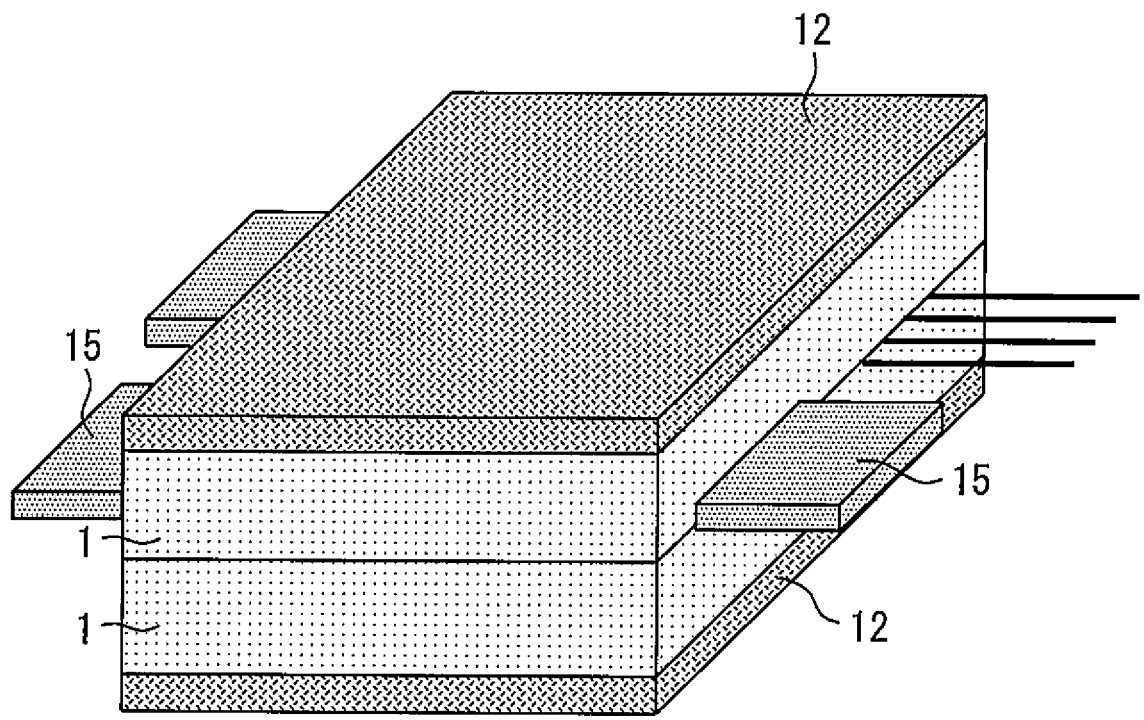
FIG. 10 and FIG. 11 are a perspective view and a cross-sectional view respectively illustrating a semiconductor device according to a fifth embodiment of the present invention.
Figure 11:
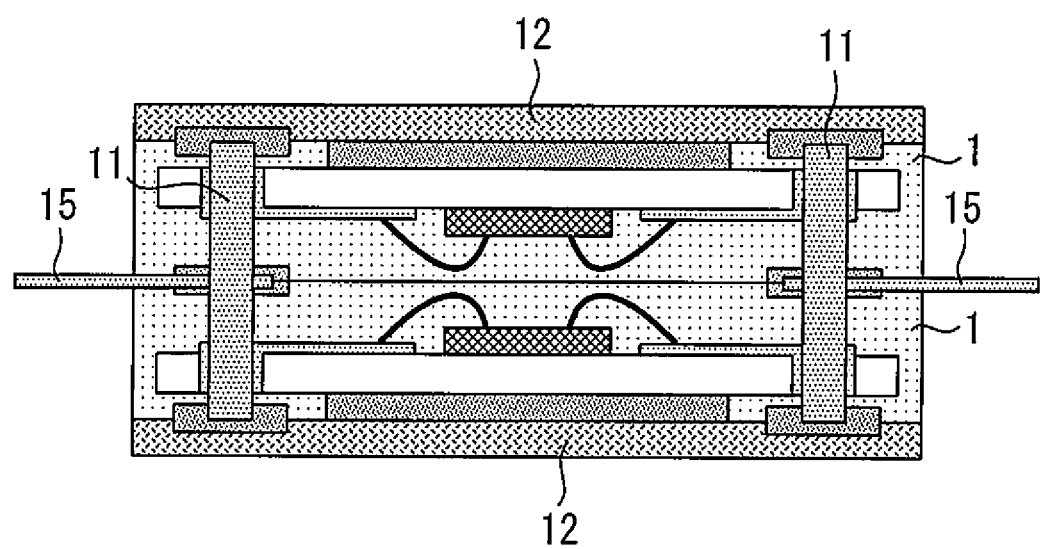

FIG. 10 and FIG. 11 are a perspective view and a cross-sectional view respectively illustrating a semiconductor device according to a fifth embodiment of the present invention. An electrode 11 does not stick out of top and bottom surfaces of the device and tabular terminals 15 connected to the electrodes 11 are pulled out of gaps between the top surfaces of the two semiconductor packages 1. These terminals 15 allow electric connections with other devices. Furthermore, since the top surfaces of the two semiconductor packages 1 are in close contact with each other and there is no space between the packages, it is possible to secure electrical creepage and spatial distances between the left and right terminals 15.

Sixth Embodiment

Figure 12:
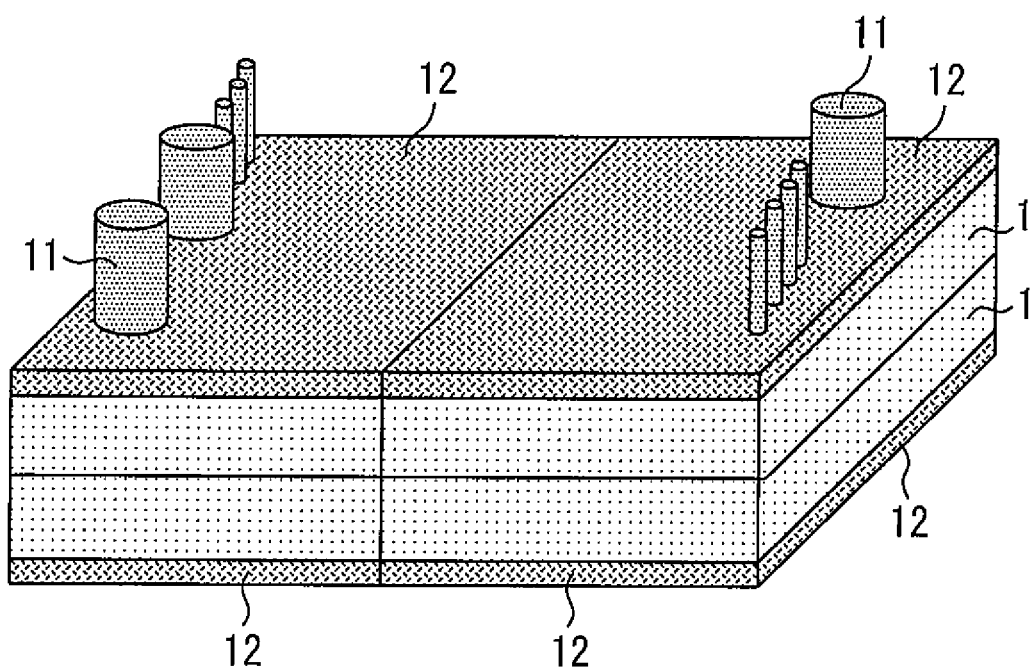
FIG. 12 and FIG. 13 are a perspective view and a cross-sectional view respectively illustrating a semiconductor device according to a sixth embodiment of the present invention.
Figure 13:
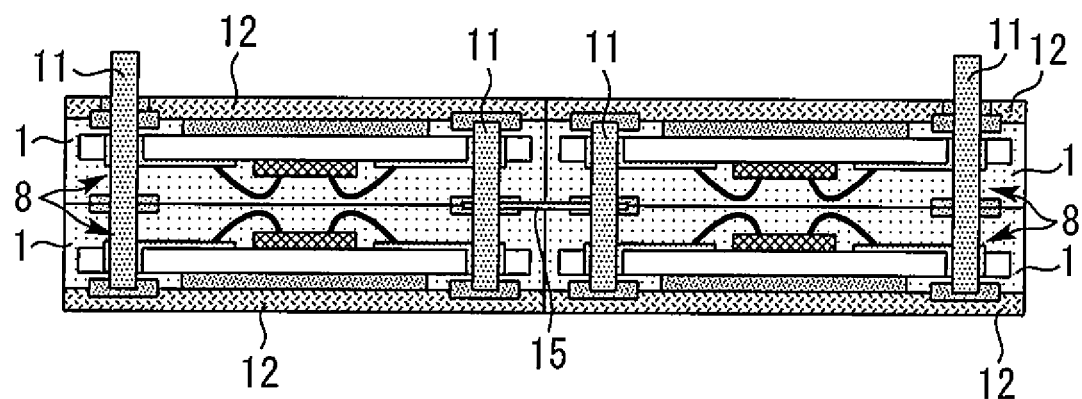

FIG. 12 and FIG. 13 are a perspective view and a cross-sectional view respectively illustrating a semiconductor device according to a sixth embodiment of the present invention. Two units are arranged side by side, each unit being composed of two semiconductor packages 1 superimposed one on another and both units being connected together via a terminal 15. The entire configuration constitutes a power module that performs one function.

Seventh Embodiment

Figure 14:
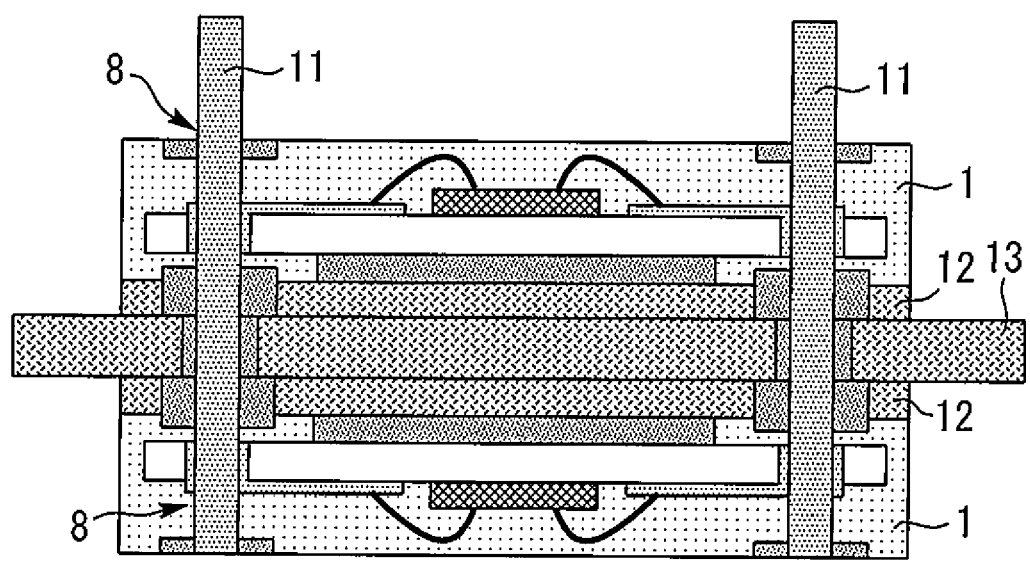
FIG. 14 is a cross-sectional view illustrating a semiconductor device according to a seventh embodiment of the present invention.

FIG. 14 is a cross-sectional view illustrating a semiconductor device according to a seventh embodiment of the present invention. Bottom surfaces of two semiconductor packages 1 are placed face to face. A radiator fin 13 such as a water cooling fin is placed between the bottom surfaces of the two semiconductor packages 1 and electrodes 11 are inserted into through holes 8 of the two semiconductor packages 1. A power device is thereby configured in which the two semiconductor packages 1 are electrically and mechanically connected together to increase the capacity. The radiator fin 13 can exhaust heat generated due to the increase in capacity.

Eighth Embodiment

Figure 15:
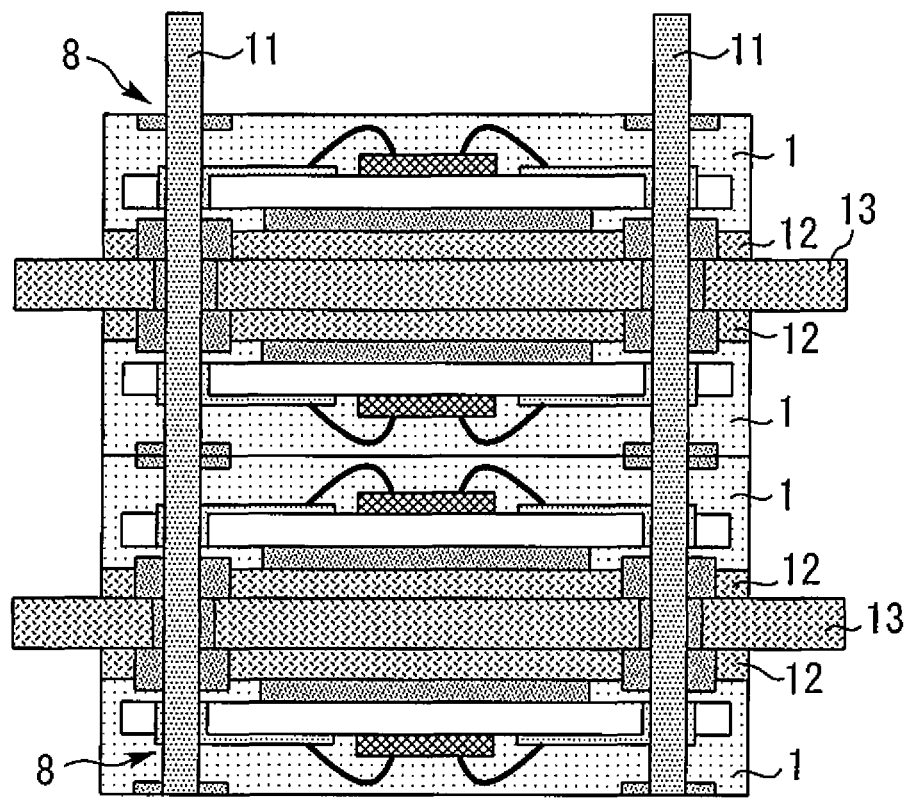
FIG. 15 is a cross-sectional view illustrating a semiconductor device according to an eighth embodiment of the present invention.

FIG. 15 is a cross-sectional view illustrating a semiconductor device according to an eighth embodiment of the present invention. Two units are superimposed one on another, each unit being composed of two semiconductor packages 1 and a radiator fin 13 and electrodes 11 being inserted into through holes 8 of the semiconductor packages 1 of each unit. The entire configuration constitutes a power module that performs one function.

Ninth Embodiment

Figure 16:
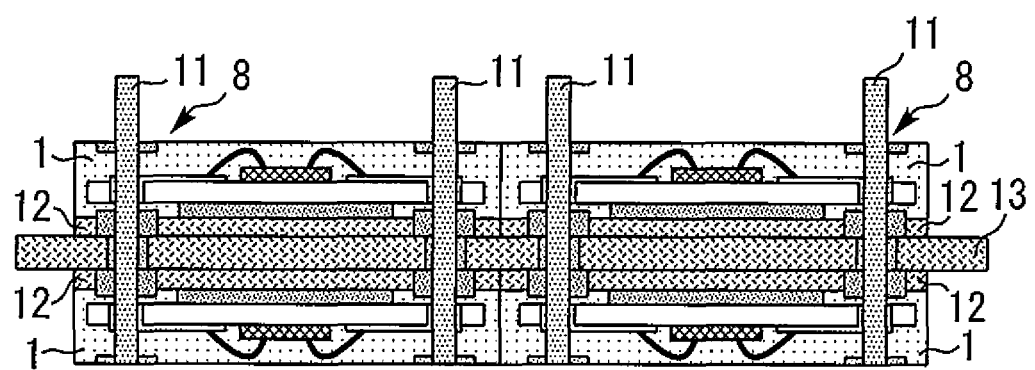
FIG. 16 is a cross-sectional view illustrating a semiconductor device according to a ninth embodiment of the present invention.

FIG. 16 is a cross-sectional view illustrating a semiconductor device according to a ninth embodiment of the present invention. Two units are arranged side by side, each unit being composed of two semiconductor packages 1 superimposed one on another and both units being connected together via one radiator fin 13. The entire configuration constitutes a power module that performs one function.

The semiconductor chip 3 is not limited to one formed of silicon, but may also be formed of a wideband gap semiconductor having a wider gap than that of silicon. The wideband gap semiconductor is, for example, silicon carbide, gallium-nitride-based material or diamond. The semiconductor chip 3 formed of such a wideband gap semiconductor has a high withstand voltage and a high maximum allowable current density, and can thereby be downsized. Using such a compact element also makes it possible to downsize the semiconductor device incorporating this element. Furthermore, since the element has a high thermal resistance, it is possible to downsize the heat spreader 12 and the radiator fin 13, and substitute the water-cooling part by an air-cooling part, and thereby further downsize the semiconductor module. Furthermore, since the element has low power loss and high efficiency, a high efficiency semiconductor device can be realized.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-185354, filed on Aug. 24, 2012 including specification, claims, drawings and summary, on which the Convention priority of the present application is based, are incorporated herein by reference in its entirety.

What is claimed is:

1. A semiconductor device comprising:
   a semiconductor package having a top surface, a bottom surface, and a through hole provided from the top surface to the bottom surface; and
   an electrode inserted into the through hole of the semiconductor package,
   wherein the semiconductor package includes:
      an insulating substrate;
      a semiconductor chip on the insulating substrate;
      an electrode pattern on the insulating substrate and connected to the semiconductor chip;
      a resin sealing the insulating substrate, the semiconductor chip, and the electrode pattern; and
      an electrode section on an inner wall of the through hole and connected to the electrode pattern,
   the through hole penetrates the insulating substrate and the resin,
   the electrode and the electrode section are different members,
   the electrode section is contacted to a side surface of the electrode inserted into the through hole,
   the electrode is connected to the electrode section inside the semiconductor package,
   the semiconductor package includes first and second semiconductor packages,
   top surfaces of the first and second semiconductor packages are placed face to face,
   heat spreaders are disposed on bottom surfaces of the first and second semiconductor packages respectively,
   the electrode is inserted into the through hole penetrating the first and second semiconductor packages,
   the semiconductor device further comprising a terminal connected to the electrode, pulled out of a gap between the top surfaces of the first and second semiconductor packages, and extending outward from side surfaces of the first and second semiconductor packages, and
   the though hole and the electrode are sized such that the electrode is slidably insertable into the through hole.

2. The semiconductor device according to claim 1, further comprising:
   a heat spreader on the bottom surface of the semiconductor package; and
   an insulating material under the through hole and insulating the electrode from the heat spreader.

3. The semiconductor device according to claim 1, wherein the first and second semiconductor packages constitute a unit, and two of the units are arranged side by side, and
   the electrodes penetrating the first and second semiconductor packages of each of the two units are connected together via the terminal.

4. The semiconductor device according to claim 1, wherein the electrode includes a first portion protruding from an outer surface of the resin and a second portion in the through hole in the insulating substrate, and each of the first and second portions have substantially the same width as measured in a direction perpendicular to a longitudinal direction of the electrode.

5. The semiconductor device according to claim 1, wherein the electrode pattern is directly on the insulating substrate.

6. The semiconductor device according to claim 1, wherein the electrode pattern is on the insulating substrate, between the semiconductor chip and the electrode, and connected to the semiconductor chip.

7. The semiconductor device according to claim 1, wherein the electrode pattern extends outwardly from a position adjacent a side surface of the semiconductor chip facing the electrode and toward the electrode.

* * * * *